US010549983B2

(12) United States Patent
Kaiser

(10) Patent No.: US 10,549,983 B2
(45) Date of Patent: Feb. 4, 2020

(54) MICROMECHANICAL STRUCTURE HAVING A COPPER CIRCUIT TRACE

(71) Applicant: Robert Bosch GmbH, Stuttgart (DE)

(72) Inventor: Christoph Kaiser, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/210,324

(22) Filed: Dec. 5, 2018

(65) Prior Publication Data
US 2019/0177156 A1   Jun. 13, 2019

(30) Foreign Application Priority Data
Dec. 13, 2017   (DE) .................. 10 2017 222 565

(51) Int. Cl.
*H01L 21/02* (2006.01)
*B81B 3/00* (2006.01)
*B81C 1/00* (2006.01)
*H01L 21/60* (2006.01)

(52) U.S. Cl.
CPC .......... *B81B 3/0072* (2013.01); *B81B 3/0094* (2013.01); *B81C 1/00801* (2013.01); *H01L 21/0259* (2013.01); *B81B 2203/01* (2013.01); *B81C 2201/014* (2013.01); *B81C 2201/0132* (2013.01); *H01L 2021/60285* (2013.01)

(58) Field of Classification Search
CPC ......... H01L 21/02365; H01L 21/02518; H01L 2021/60; H01L 2021/60285; H01L 21/64; H01L 24/35; H01L 24/38; H01L 24/39; H01L 24/71
See application file for complete search history.

(56) References Cited

U.S. PATENT DOCUMENTS 8,218,218 B2   7/2012   Tauscher et al.

OTHER PUBLICATIONS

Osaka et al., "Electrochemical Deposition Process for ULS Interconnection Devices" in "Modern Electroplating" edited by Mordechay Schlesinger and Milan Paunovic, Chapter 13.

*Primary Examiner* — Cheung Lee
(74) *Attorney, Agent, or Firm* — Norton Rose Fulbright US LLP; Gerard Messina

(57) ABSTRACT

A micromechanical structure includes a fixing point, a silicon spring, and a movable part. The silicon spring is connected to the fixing point at a first end and to the movable part at a second end. At least one copper circuit trace is situated on the silicon spring and extends at least from the first end to the second end. The copper circuit trace has a layer structure including a plurality of contiguous copper layers.

6 Claims, 3 Drawing Sheets

MICROMECHANICAL STRUCTURE HAVING A COPPER CIRCUIT TRACE

CROSS-REFERENCE TO RELATED APPLICATIONS

The present application claims priority under 35 U.S.C. § 119 to DE 10 2017 222 565.3, filed in the Federal Republic of Germany on Dec. 13, 2017, the content of which is hereby incorporated by reference herein in its entirety.

BACKGROUND

A micromechanical structure, such as, for example, a displaceable micromirror, has a fixing point, a silicon spring, and a movable part. The silicon spring is connected to the fixing point at a first end and to the movable part at a second end. Situated on the silicon spring is at least one copper circuit trace extending at least from the first end to the second end.

MEMS sensors or actuators are often made up of a fixed element (referred to in the following as "mainland") and a movable element ("island"), which are joined to each other by a flexible structure ("spring"). If an electric current is needed on the island, then this must be brought there via the spring. In certain applications, the spring must now be narrow in order to satisfy specific mechanical requirements, but at the same time, a high electric current must be carried by the spring, which means that a material having a low specific resistance is needed as a current-carrying conductor. Osaka et al., "Electrochemical Deposition Process for ULSI Interconnection Devices," in "Modern Electroplating," edited by Mordechay Schlesinger and Milan Paunovic, Chapter 13, describes a method in which pure copper is used for a current-carrying conductor, the copper being deposited electrochemically and patterned to form circuit traces, using the Damascene process. This copper is already subject to an annealing process (self-annealing) at room temperature, through which the grain size increases into the range of several µm. This grain size is already in the range of typical layer thicknesses and circuit-trace widths used.

The function of the spring is to deform mechanically in order, thus, to allow movement of the island with respect to the mainland. This deformation must be purely elastic, in order to be reversible and reproducible. In addition, in the case of a purely elastic system, no material aging or material fatigue takes place. Furthermore, in the case of a spring deformed purely elastically, the tension at its end connected to the mainland is directly proportional to the displacement of the island. Thus, this displacement can be determined reliably, using, for example, piezoresistive bridges at the connecting point between the mainland and the spring. Silicon is mostly used as a material for the spring based on favorable mechanical properties, in particular, purely elastic behavior up to the failure limit.

Pure metals, which have a high conductivity, are very soft, that is, they have a low yield point, and thus, also the above-described, Damascene copper (as well as Au, Al). If they are used as a conductor on an above-described spring, then, in response to mechanical deformation of the spring, the film tension in the conductive material generally becomes so high, that the conductive material deforms plastically. Due to that, the overall element of the spring no longer behaves purely elastically, and the advantages described above are lost. In particular, it is no longer possible to highly accurately determine the position of the structures suspended on the spring.

In order to eliminate this conflict, according one solution, the spring is designed so that the tension in the conductive material always remains below the (very low) yield point of the conductive material. However, this is not possible for many applications. Alternatively, use of alloys in place of pure materials as conductive materials is possible. In this instance, the yield point of the metal is greater than the maximum mechanical stress occurring. In a semiconductor process, such as in the case of MEMS, this is technically highly difficult to carry out and, in the case of copper, also accompanied by a reduction in the electrical conductivity.

U.S. Pat. No. 8,218,218 describes a solution, which uses different conductive materials separated by insulating layers, in a multilayer system, which then have to be reconnected to each other at the ends of the spring. This is a technically highly complex solution, in which, additionally, on the basis of the height of the overall structure, electrical conductivity is markedly lost due to the insulating layers used. Alternatively, it is possible to increase the yield point by reducing the geometric dimensions of the metallic traces. However, the result of this is that the available conductive cross section and, consequently, the maximum current are markedly reduced.

SUMMARY

An object of the present invention is to provide an overall structure of a micromechanical spring and conductor that behave mechanically purely elastically and nevertheless have a high electrical conductivity in the conductive material.

According to an example embodiment of the present invention, a micromechanical structure having a fixing point, a silicon spring and a movable part. The silicon spring is connected to the fixing point at a first end and to the movable part at a second end. At least one copper circuit trace is situated on the silicon spring and extends at least from the first end to the second end. The copper circuit trace has a layer structure including a plurality of contiguous copper layers. In this manner, the yield point of the circuit trace is increased by changes in the inner material structure.

It is advantageous that the copper circuit trace has a maximum grain size determined by a layer thickness of the copper layer. It is particularly advantageous that the copper circuit trace has a maximum grain size of d<1 µm. One advantageous refinement of the present invention provides that the copper circuit trace has a high level of twinned crystals. It is also advantageous that at least two copper circuit traces are situated on the silicon spring.

A spring advantageously connects a fixing point or a "mainland" to a movable part or an "island." The spring has selected mechanical characteristics and deforms purely elastically in its operating range. Copper circuit traces are patterned on the spring, using the Damascene process, the copper being highly fine-grained. Due to this, it continues to have a high electrical conductivity, but also a high yield point. Because of that, this circuit trace also deforms elastically in the operating range of the spring. The copper optionally has a high level of twinned crystals, through which the effect on mechanical stabilization and, furthermore, high conductivity described in the previous point is amplified even more.

The present invention advantageously provides an overall spring/circuit trace system, which behaves purely elastically in the operating range. This produces a high level of reversibility, reproducibility, and reliability of the overall spring/circuit trace system. The thermal stability of the crystal structure, and with it, the described, improved properties of the copper, are also advantageous. The circuit traces have an increased resistance to electromigration. In contrast to the related art, such as U.S. Pat. No. 8,218,218, the production of the micromechanical structure of the present invention requires only a small degree of technological expenditure, since starting from a copper circuit trace made out of a copper layer, only one deposition process has to be changed.

An example embodiment of the present invention relates to a method for manufacturing a micromechanical structure having a silicon spring, which includes a copper circuit trace that has a layer structure possessing a plurality of contiguous copper layers. The method includes: providing a silicon wafer having a lower oxide layer on it, a silicon layer situated above the lower oxide layer, and an upper oxide layer situated above the silicon layer; patterning a trench into the upper oxide layer; galvanically depositing a copper circuit trace in the trench, a plurality of contiguous copper layers being deposited by depositing copper using a high current density and a low current density in an alternating manner; depositing a passivation layer over the copper circuit trace and the upper oxide layer; patterning a spring into the passivation layer, the upper oxide layer and the silicon layer, stopping at the lower oxide layer, the spring also including the copper circuit trace; and releasing the spring by removing the lower oxide underneath it.

Using the method of the present invention, the deposition of highly elastic copper as a circuit trace can be integrated into a MEMS manufacturing process in an advantageous manner.

DETAILED DESCRIPTION

Figure 1:
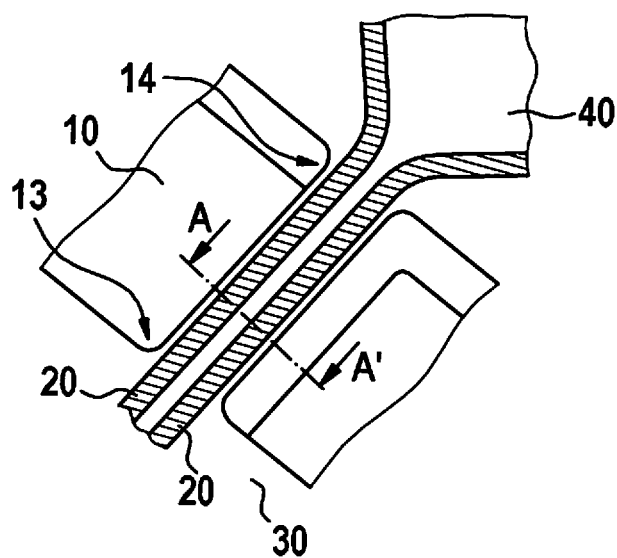
FIG. 1 schematically shows a micromechanical structure having a copper circuit trace, according to an example embodiment of the present invention.
Figure 2:
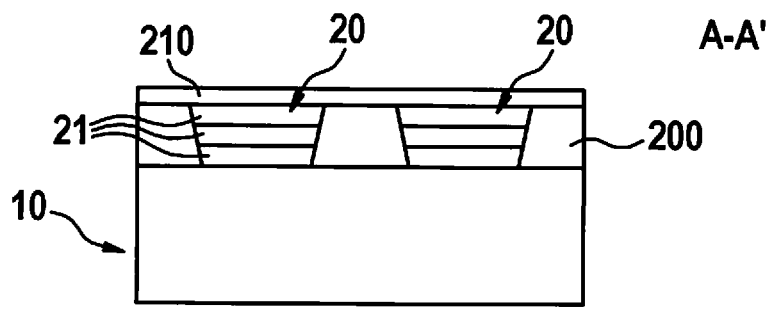
FIG. 2 schematically shows a cross section of the micromechanical structure of FIG. 1, according to an example embodiment of the present invention.

FIG. 1 schematically shows a micromechanical structure having a copper circuit trace, according to an example embodiment of the present invention. A micromechanical structure having a fixing point 30, a silicon spring 10, and a movable part 40 is depicted. Silicon spring 10 is connected to the fixing point at a first end 13 and to movable part 40 at a second end 14. In this manner, movable part 40 is suspended flexibly relative to fixing point 30 with the aid of silicon spring 10. Two copper circuit traces 20 are situated on silicon spring 10, the copper circuit traces extending at least from first end 13 to second end 14 and being made of fine-grained copper, for example, having grain sizes d<1 µm. In this context, the copper circuit traces have a layer structure including a plurality of contiguous copper layers 21. To that end, FIG. 2 schematically shows a cross section of the micromechanical structure of the present invention, from FIG. 1. Copper circuit traces 20 are situated in grooves in an upper oxide layer 200 on the upper surface of silicon spring 10. A passivation layer 210 is situated above the copper circuit traces and the upper oxide layer.

An overall structure of spring+circuit trace, which behaves mechanically purely elastically and nevertheless provides a high electrical conductivity in the conductive material, is produced as described in the following.

The Cu for the copper circuit trace is deposited in a Damascene process. For this, the copper is introduced into a groove, provided beforehand, in the upper oxide layer on the silicon spring. In this instance, the copper is galvanically deposited. During the electroplating, modulation of the applied current causes the copper to be deposited in a layer structure having a plurality of superposed, contiguous copper layers 21. The thickness of the respective copper layer 21 substantially determines the maximum grain size of copper in this layer.

Figure 3:
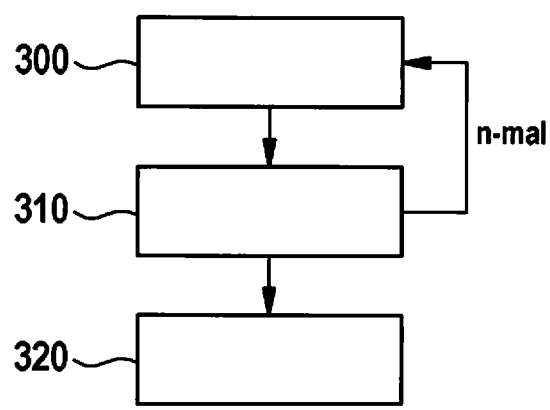
FIG. 3 is a flowchart that illustrates a manufacturing process of a copper circuit trace made up of n+1 copper layers, according to an example embodiment of the present invention.

FIG. 3 schematically shows a manufacturing process of a copper circuit trace made up of n+1 copper layers. In a manufacturing step 300, copper is galvanically deposited at a high current, for example, at a current density>>15 mA/cm$^2$. In a manufacturing step 310, copper is subsequently deposited at a low current, for example, at a current density<15 mA/cm$^2$. This sequence is carried out n times. In a manufacturing step 320, copper is subsequently deposited at a high current, for example, at a current density>>15 mA/cm$^2$. This method can be put at the beginning of a method for manufacturing a micromechanical device of the present invention.

Figure 4:
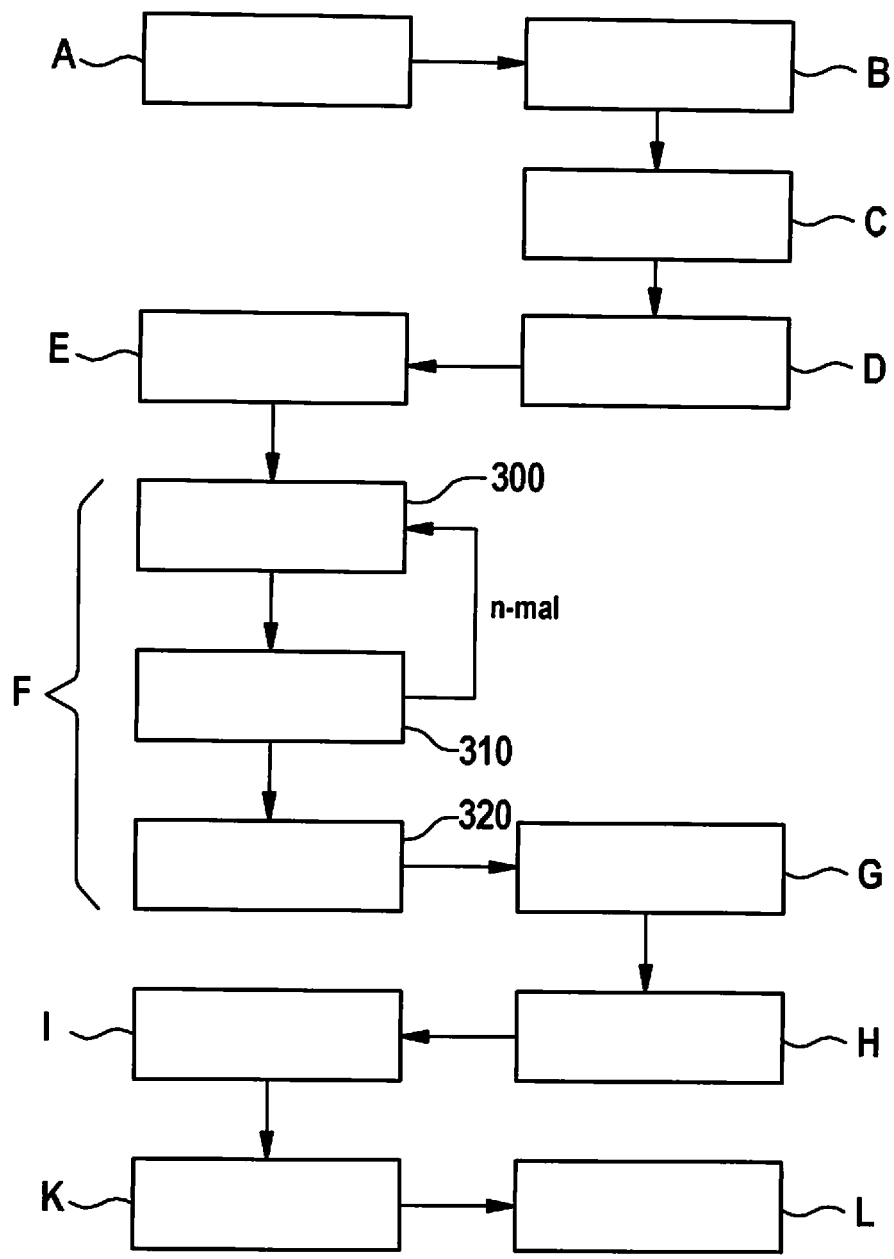
FIG. 4 is a flowchart that illustrates a method for manufacturing a micromechanical structure having a copper circuit trace, according to an example embodiment of the present invention.

FIG. 4 schematically shows a method for manufacturing a micromechanical structure having a copper circuit trace, according to an example embodiment of the present invention. In a step A, a silicon wafer 1 having a lower oxide layer 100 situated on it and a silicon layer 110 situated on the lower oxide layer is provided. In a step B, an upper oxide layer 200 is deposited on the upper surface of the wafer, that is, on silicon layer 110. In a step C, a copper circuit trace 20 is defined, using photolithography. In a step D, a trench is patterned into oxide layer 200, using, for example, dry-etching. Subsequently, the resist is removed, for example, using plasma ashing. In a step E, a suitable diffusion barrier and a Cu seed layer are deposited, for example, using cathode sputtering. In a step F, a copper circuit trace made up of n+1 copper layers is produced, using galvanic deposition as described with regard to FIG. 3. In a step G, copper is removed, for example, by CMP, until the copper only remains in the previously patterned trenches in upper oxide layer 200. In a step H, a passivation layer is deposited over copper circuit traces 20 and upper oxide layer 200. In a step I, a spring 10 is defined with the aid of photolithography. In a step K, using dry-etching, for example, spring 10 is patterned into passivation layer 210, upper oxide layer 200 and silicon layer 110, stopping on lower oxide layer 100. Subsequently, the photoresist is removed, for example, using plasma ashing. In a step L, spring 10 is released by removing the lower oxide 100 under it, for example, using gas-phase etching.

Figure 5:
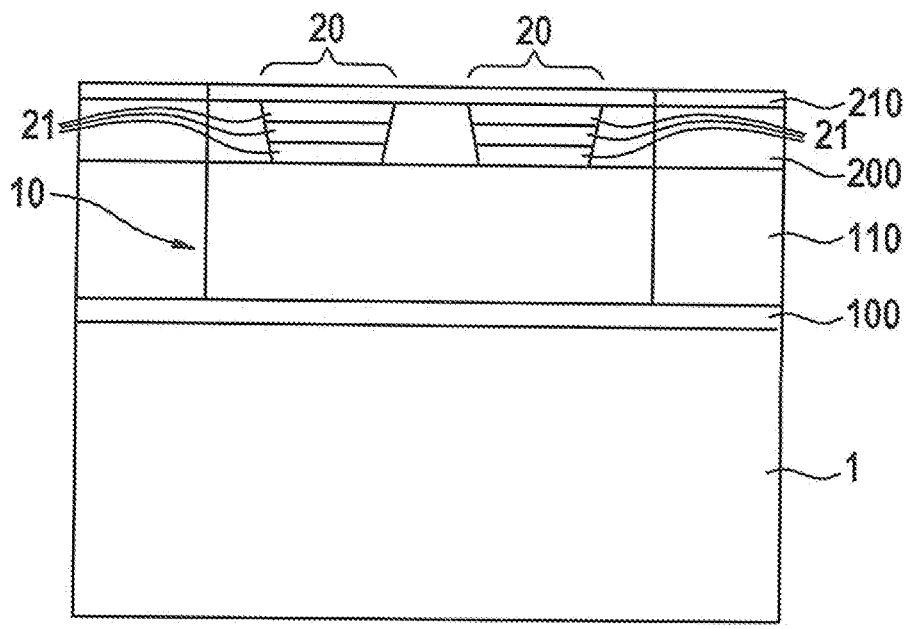
FIG. 5 shows a first stage of the micromechanical structure having a copper circuit trace after deposition of the copper and prior to patterning the spring, according to an example embodiment of the present invention.

FIG. 5 shows a first stage of the micromechanical structure having a copper circuit trace, according to an example embodiment of the present invention, after deposition of the copper and prior to patterning the spring. A silicon wafer 1 having a lower oxide layer 100 situated on it is depicted. Over oxide layer 100, a silicon layer 110 and upper oxide layer 200 are positioned in this order. Upper oxide layer 200 includes grooves in which copper circuit traces 20 made up of thin copper layers 21 are galvanically deposited. Copper circuit traces 20 and upper oxide layer 200 are covered by a passivation layer 210. The dashed lines schematically indicate the boundary of the silicon spring 10 to be subsequently patterned out of silicon layer 110, upper oxide layer 200, and passivation layer 210. Thus, copper circuit traces 20 are situated in grooves in upper oxide layer 200, at the upper surface of future silicon spring 10.

The Damascene Cu circuit traces are constructed as highly fine-grained copper having, for example, grain sizes of $d<1$ µm. Due to this, the yield point in the copper increases markedly in accordance with the Hall-Petch relationship (for example, according to Gottstein, "Physikalische Grundlagen der Materialkunde" (Physical Principles of Materials Science), $3^{rd}$ Edition, Springer-Verlag, Berlin, Heidelberg, 2007, pp. 260 ff., formula (6.92b), as well as Table 6.5, from 74 MPa at $d=5$ µm to 148 MPa at $d=0.8$ µm), which means that operation in the purely elastic range is possible for many applications. However, the electrical conductivity is affected only negligibly by this. In this instance, the fine-grained structure of the copper is thermally and mechanically stable, which means that its advantages are even reliably available in the case of prolonged operation. This type of construction of the Cu traces only generates a low level of extra technical expense in the deposition step of the Cu itself, but no additional masking levels, layers or the like are necessary.

In addition, the fine-grained copper can be produced in a manner allowing many twinned crystals to form, which are effective for mechanical stabilization, but scarcely reduce the electrical conductivity.

The publications, Shen et al., "Tensile properties of copper with nano-scale twins," Scripta Materialia 52 (2005) 989-994, and Wang et al., "An electroplating method for copper plane twin boundary manufacturing," Thin Solid Films 544 (2013) 157-161, describe methods for producing, using electrochemical deposition, such fine-grained, full-surface copper layers, which are made up of a plurality of partial layers and have a high level of twins. They emphasize a further advantage of such layers, namely, the increased resistance to electromigration. In Shen et al., the higher yield point of full-surface, fine-grained copper layers made up of a plurality of partial layers is experimentally confirmed.

Figure 6:
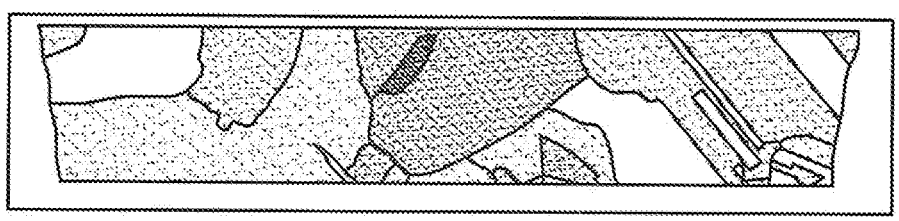
FIG. 6 is a representation of an SEM photograph of the cross section of a Cu circuit trace produced by a Damascene process at Robert Bosch GmbH.

FIG. 6 is a representation of an SEM photograph of a cross section of a copper circuit trace produced by the Damascene process at Robert Bosch GmbH. The thickness of the Cu circuit trace is 3.8 µm.

Figure 7:
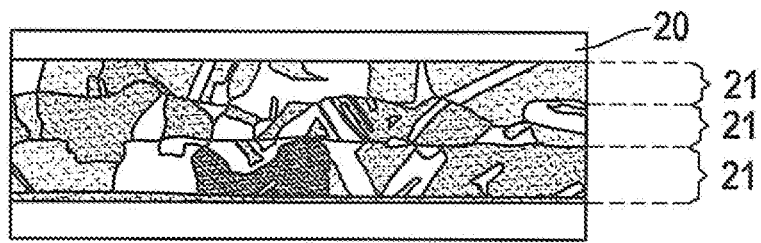
FIG. 7 is a representation of an SEM photograph of the cross section of a Cu layer produced at Robert Bosch GmbH using an adapted electroplating recipe, according to an example embodiment of the present invention.

FIG. 7 is a representation of an SEM photograph of the cross section of a copper circuit trace produced at Robert Bosch GmbH using an adapted galvanic deposition recipe. The thickness of the Cu circuit trace is 3 µm. In this context, copper circuit trace 20 has a layer structure including a plurality of contiguous copper layers 21. In this instance, the layer thickness of each individual copper layer 21 is approximately 1 µm. One clearly recognizes the grain size of $d<1$ µm, which is reduced in comparison with the specimen shown in FIG. 6. The grain size is evidently limited by the layer thickness of the respective copper layer 21.

What is claimed is:

1. A micromechanical structure comprising:
   a fixing point;
   a movable part;
   a silicon spring connected to the fixing point at a first end of the silicon spring and connected to the movable part at a second end of the silicon spring; and
   at least one copper circuit trace that is situated on the silicon spring, extends at least from the first end to the second end, and is formed as a layer structure including a plurality of contiguous copper layers.

2. The micromechanical structure of claim 1, wherein the at least one copper circuit trace has, for each of the copper layers of the respective trace, a respective maximum grain size determined by a layer thickness of the respective copper layer.

3. The micromechanical structure of claim 2, wherein the at least one copper circuit trace has a maximum grain size of $d<1$ µm.

4. The micromechanical structure of claim 1, wherein the at least one copper circuit trace has a high level of twinned crystals.

5. The micromechanical structure of claim 1, wherein the at least one copper circuit trace includes at least two copper circuit traces situated on the silicon spring.

6. A method for manufacturing a micromechanical structure, the method comprising:
   providing a silicon wafer with a lower oxide layer on silicon wafer, a silicon layer situated above the lower oxide layer, and an upper oxide layer situated above the silicon layer;
   patterning a trench into the upper oxide layer;
   galvanically depositing a plurality of contiguous copper layers forming a copper circuit trace in the trench by depositing copper using a high current density and a low current density in an alternating manner;
   depositing a passivation layer over the copper circuit trace and the upper oxide layer;
   patterning a spring into the passivation layer, the upper oxide layer, and the silicon layer, stopping at the lower oxide layer; and
   removing the lower oxide underneath the patterned spring, thereby releasing the spring with the copper circuit trace being situated on the spring.

\* \* \* \* \*